US011990340B2

(12) United States Patent
Liu (10) Patent No.: US 11,990,340 B2
(45) Date of Patent: May 21, 2024

(54) SEMICONDUCTOR DEVICE AND METHOD OF MANUFACTURING THE SAME (71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 416 days.

(21) Appl. No.: 17/342,508

(22) Filed: Jun. 8, 2021

(65) Prior Publication Data
US 2021/0296126 A1 Sep. 23, 2021

Related U.S. Application Data (63) Continuation of application No. PCT/CN2020/111399, filed on Aug. 26, 2020.

(30) Foreign Application Priority Data

Nov. 19, 2019 (CN) .......................... 201911134775.7

(51) Int. Cl.
*H01L 21/033* (2006.01)
*H01L 21/768* (2006.01)
*H10B 12/00* (2023.01)

(52) U.S. Cl.
CPC ...... *H01L 21/0337* (2013.01); *H01L 21/0332* (2013.01); *H01L 21/76802* (2013.01); *H10B 12/01* (2023.02)

(58) Field of Classification Search
CPC ............. H01L 21/0337; H01L 21/0332; H01L 21/76802; H01L 21/31144;
(Continued)

(56) References Cited

U.S. PATENT DOCUMENTS 7,906,436 B2 * 3/2011 Konishi ............ H01L 21/31144
438/736
8,389,400 B2 * 3/2013 Lee ..................... H01L 21/0337
438/622
(Continued)

FOREIGN PATENT DOCUMENTS

CN 103911584 A 7/2014
CN 103984202 A 8/2014
(Continued)

OTHER PUBLICATIONS

European Patent Office, Office Action Issued in Application No. 20891144.6 dated Feb. 22, 2023, Netherlands, 5 pages.

*Primary Examiner* — Dale E Page
*Assistant Examiner* — Quovaunda Jefferson
(74) *Attorney, Agent, or Firm* — Kilpatrick Townsend & Stockton LLP (57) ABSTRACT

Embodiments provide a semiconductor device and a method of manufacturing the same. The method includes: providing a layer to be etched; forming a patterned first mask layer on the layer to be etched; and forming a patterned second mask layer formed on the layer to be etched, where the second mask layer and the first mask layer jointly define an opening, which exposes the layer to be etched; and etching the layer to be etched using the first mask layer and the second mask layer as masks, thus forming a pattern to be etched. The above-described method of manufacturing the semiconductor device allows the feature size of the first mask layer and the second mask layer to be relatively larger while keeping the device feature size the same, makes it possible to further reduce the feature size of the device.

6 Claims, 11 Drawing Sheets (58) Field of Classification Search
CPC ........... H01L 21/76816; H01L 21/0334; H01L 29/66227; H10B 12/00; H10B 12/01; H10B 12/485
See application file for complete search history.

(56) References Cited

U.S. PATENT DOCUMENTS

| | | |
|---|---|---|
| 10,522,350 B2* | 12/2019 | Kwon ............... H01L 29/40117 |
| 2006/0240361 A1* | 10/2006 | Lee .................... H01L 21/0337 |
| | | 430/311 |
| 2009/0298276 A1 | 12/2009 | Lee et al. |
| 2019/0019676 A1* | 1/2019 | Zhang ................ H01L 21/0332 |
| 2019/0187562 A1 | 6/2019 | Wang et al. |

FOREIGN PATENT DOCUMENTS

| | | | |
|---|---|---|---|
| CN | 104681429 | A | 6/2015 |
| CN | 108519725 | A | 9/2018 |
| CN | 210575830 | U | 5/2020 |
| KR | 20120074902 | A | 7/2012 |

* cited by examiner

FIG. 11c

SEMICONDUCTOR DEVICE AND METHOD OF MANUFACTURING THE SAME

CROSS REFERENCE TO RELATED APPLICATIONS

This application is a continuation of PCT/CN2020/111399, filed Aug. 26, 2020, which claims the priority to and benefit of Chinese application number 201911134775.7, entitled "Semiconductor Device and Method of Manufacturing the Same" and filed on Nov. 19, 2019 with China Intellectual Property Administration, the disclosure of which is hereby incorporated herein in its entirety.

TECHNICAL FIELD

This disclosure relates to the field of semiconductors, and more particularly to a semiconductor device and a method of manufacturing the same.

BACKGROUND

In electronics, integrated circuit (IC), also referred to as microcircuit, microchip, or chip, is a method of miniaturizing circuits (mainly including semiconductor devices, but also passive components, etc.), and is usually manufactured on the surface of a semiconductor wafer. For example, DRAM (Dynamic Random Access Memory), namely dynamic random access memory chip, is the most common memory chip. Over the years, DRAM has continued to develop towards smaller dimensions, allowing more circuits to be packaged per chip. This increases the capacity per unit area, which can reduce costs and increase functionality.

SUMMARY

The disclosure provides a semiconductor device and a method of manufacturing the same.

The present disclosure provides a method of manufacturing a semiconductor device, the method including: providing a layer to be etched; forming a patterned first mask layer on the layer to be etched; and forming a patterned second mask layer on the layer to be etched, where the second mask layer and the first mask layer jointly define an opening, and the opening exposes the layer to be etched; and etching the layer to be etched to form a pattern to be etched using the first mask layer and the second mask layer as masks.

The present disclosure further provides a semiconductor device including: a layer to be etched; a patterned first mask layer formed on the layer to be etched; and a patterned second mask layer formed on the layer to be etched, where the second mask layer and the first mask layer jointly define an opening, and the opening exposes the layer to be etched.

Details of one or more embodiments of this application are set forth in the following drawings and description. Other features and advantages of this application will become apparent from the description, drawings and claims.

BRIEF DESCRIPTION OF THE DRAWINGS

In order to provide a better understanding for the technical solutions portrayed in the embodiments of the present application, the following will briefly introduce the drawings that are needed in the embodiments. Evidently, the drawings in the following description merely illustrate some embodiments of the present application. A person having ordinary skill in the art will be able to obtain other drawings based on these drawings without investing creative efforts.

| | |
|---|---|
| 10 | Layer to be etched |
| 20 | First mask layer |
| 201 | First strip mask |
| 202 | First window |
| 30 | Second mask layer |
| 301 | Second strip mask |
| 302 | Second window |
| 40 | Opening |
| 50 | Recess |

DETAILED DESCRIPTION OF EMBODIMENTS

As mentioned in the Background section, DRAM continues to develop toward smaller dimensions, which requires continuous reduction of the minimum line width and spacing of integrated circuit design. However, when the feature size of the exposure lines approaches the theoretical resolution limit of the exposure system, the imaging on the surface of the silicon wafer will be severely distorted, resulting in a serious degradation of the quality of the photolithography image.

In order to facilitate the understanding of the present disclosure, the present disclosure will be described in greater detail below with reference to the related drawings. The exemplary embodiments according to this disclosure are illustrated in the drawings. However, the present disclosure can be practiced in many different forms and thus will not be limited to the embodiments described herein. On the contrary, the purpose of providing these embodiments is to make the present disclosure more thorough and comprehensive.

Unless otherwise defined, all technical and scientific terms used herein have the same meaning as commonly understood by those skilled in the technical field to which the present disclosure pertains. The terms used in the specification of the present disclosure herein are intended for mere purposes of describing some specific embodiments, and are not intended to limit the present disclosure by any means or forms. The term "and/or" as used herein is intended to include any and all combinations of one or more related listed items.

As used herein, terms "upper", "lower", "vertical", "horizontal", "inner", "outer", etc. are used to indicate the orientational or positional relationships based on those depicted in the drawings, which are merely intended for the sake of convenience of describing the present disclosure and simplifying the description, rather than indicating or implying that the device or element referred to must have a specific orientation, or be constructed and operated in a specific orientation, and therefore are not to be understood as restricting the present disclosure.

Figure 1:
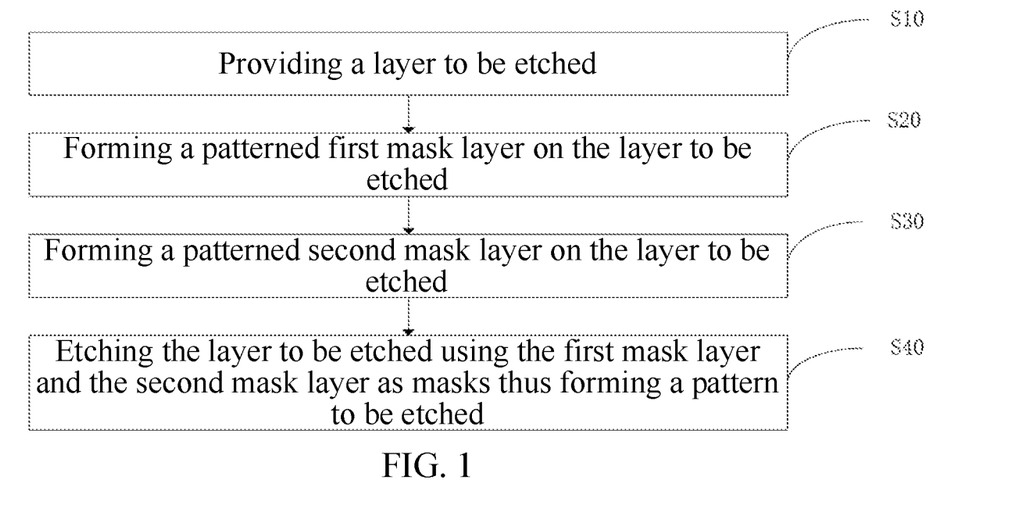
FIG. 1 is a flowchart illustrating a method for manufacturing a semiconductor device according to the present disclosure.

In an embodiment, as illustrated in FIG. 1, there is provided a method of manufacturing a semiconductor device, the method including: providing a layer 10 to be etched; forming a patterned first mask layer 20 on the layer 10 to be etched; forming a patterned second mask layer 30 on the layer 10 to be etched, where the second mask layer 30 and the first mask layer 20 jointly define an opening 40, which exposes the layer to be etched 10; and etching the layer 10 to be etched using the first mask layer 20 and the second mask layer 30 as masks, thus forming a pattern to be etched.

In this embodiment, the above-described method of manufacturing the semiconductor device allows the feature size of the first mask layer 20 and the second mask layer 30 to be relatively larger while keeping the device feature size the same, makes it possible to further reduce the feature size of the device, and can also improve the yield of the device and save costs.

Figure 2:
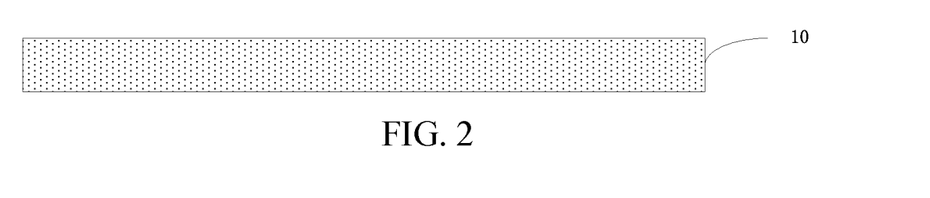
FIGS. 2 to 5 are schematic diagrams illustrating the structure presented in each step of the method of manufacturing the semiconductor device according to the present disclosure.

S10: providing a layer 10 to be etched, as illustrated in FIG. 2.

Figure 3:
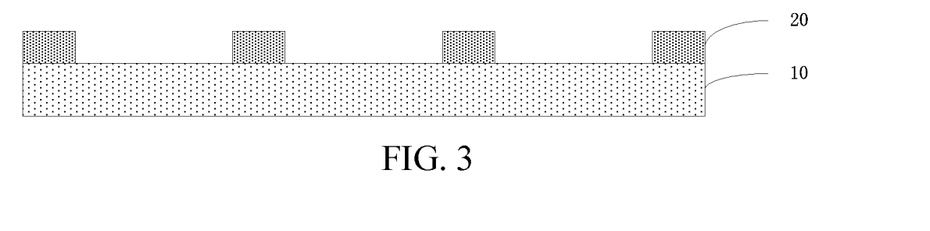

S20: forming a patterned first mask layer 20 on the layer 10 to be etched, as illustrated in FIG. 3.

In one embodiment, the method of forming the first mask layer 20 includes chemical vapor deposition or atomic layer deposition. The material of the first mask layer 20 includes one or more selected from the following materials: silicon oxide, silicon nitride, silicon carbide, silicon oxynitride, amorphous carbon, polysilicon, hafnium oxide, titanium oxide, zirconium oxide, titanium nitride, tantalum nitride, and titanium.

Figure 4:
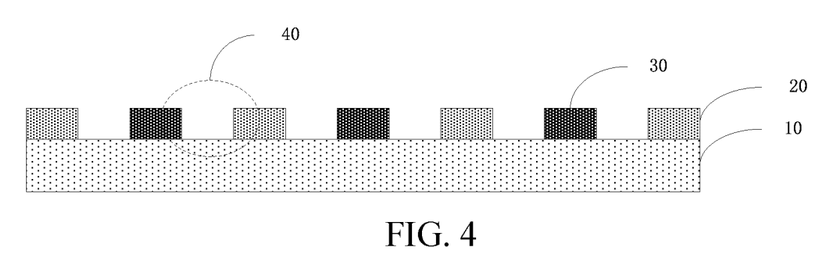

S30: forming a patterned second mask layer 30 on the layer 10 to be etched, where the second mask layer 30 and the first mask layer 20 jointly define an opening 40, which exposes the layer to be etched 10, as illustrated in FIG. 4.

In one embodiment, the method of forming the second mask layer 30 includes chemical vapor deposition or atomic layer deposition. The material of the second mask layer 30 includes one or more selected from the following materials: silicon oxide, silicon nitride, silicon carbide, silicon oxynitride, amorphous carbon, polysilicon, hafnium oxide, titanium oxide, zirconium oxide, titanium nitride, tantalum nitride, and titanium.

Figure 5:
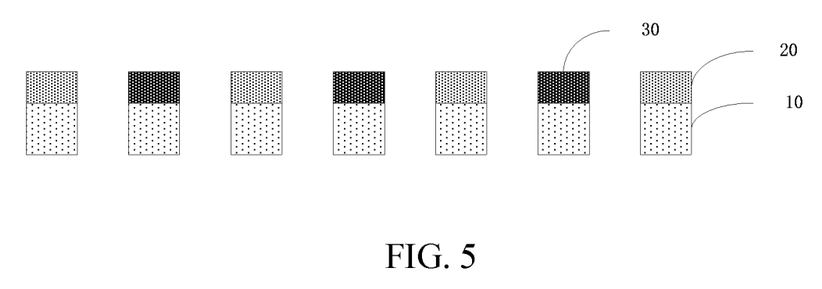

S40: etching the layer 10 to be etched using the first mask layer 20 and the second mask layer 30 as masks thus forming a pattern to be etched, as illustrated in FIG. 5.

In this embodiment, the material of the first mask layer 20 is different than the material of the second mask layer 30, and a large etching selection ratio is required.

In another embodiment, between S20 and S30 there is further included the operation of forming a dielectric layer on the first mask layer 20. That is, after the dielectric layer is formed on the first mask layer 20, the second mask layer 30 may be formed on the dielectric layer. At this time, the first mask layer 20 and the second mask layer 30 do not lie on the same plane. The material of the dielectric layer is different from the material of the first mask layer 20 and the material of the second mask layer 30 and requires a large etching selection ratio, where the material of the first mask layer 20 may be the same as that of the second mask layer 30.

In one embodiment, the method of forming the dielectric layer includes chemical vapor deposition or atomic layer deposition. The material of the dielectric layer includes one or more selected from the following materials: silicon oxide, silicon nitride, silicon carbide, silicon oxynitride, amorphous carbon, polysilicon, hafnium oxide, titanium oxide, zirconium oxide, titanium nitride, tantalum nitride, and titanium.

In one embodiment, the opening 40 includes a bit line contact hole.

In one embodiment, the first mask layer 20 includes a plurality of first strip masks 201 parallel to each other, and the second mask layer 30 includes a plurality of second strip masks 301 parallel to each other. The plurality of first strip masks 201 and the plurality of second strip masks 301 are alternately arranged in side by side.

In this embodiment, the plurality of first strip masks 201 are arranged equidistantly, and the plurality of second strip masks 301 are arranged equidistantly.

Figure 8A:
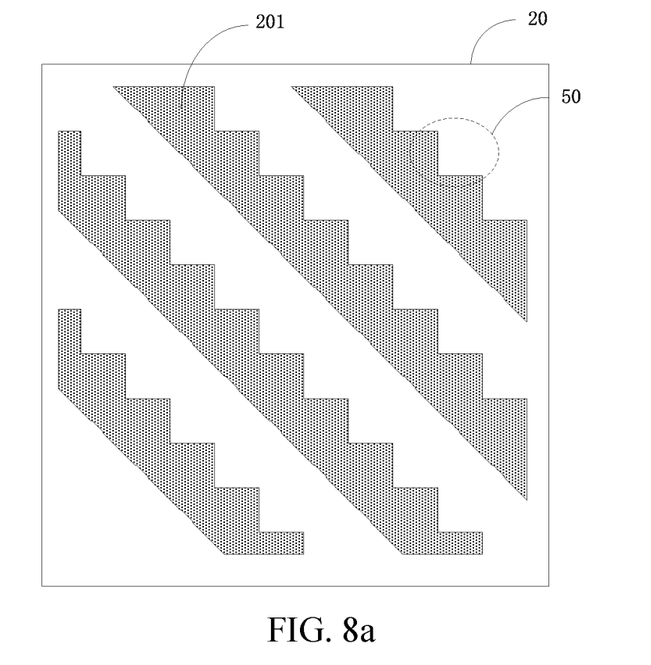
FIG. 8a is a top view of a first mask layer in a semiconductor device according to yet another embodiment of the present disclosure.
Figure 8B:
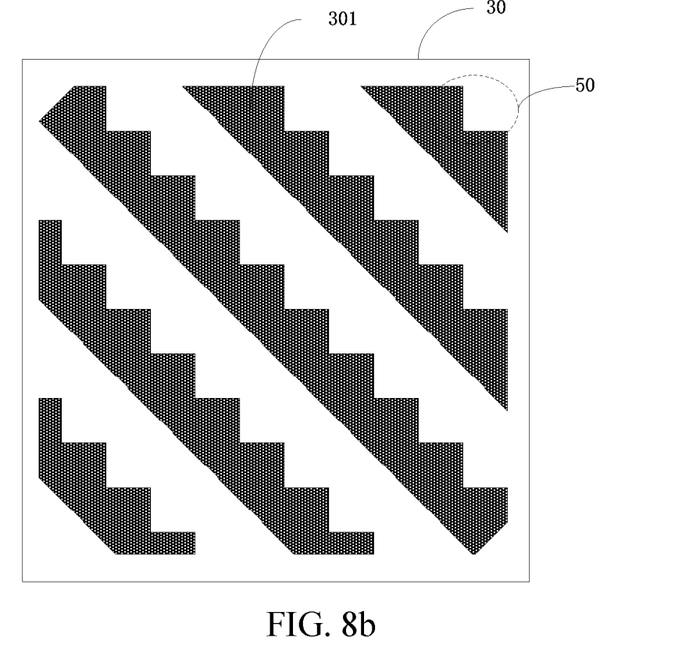
FIG. 8b is a top view of a second mask layer in the semiconductor device according to yet another embodiment of the present disclosure.
Figure 8C:
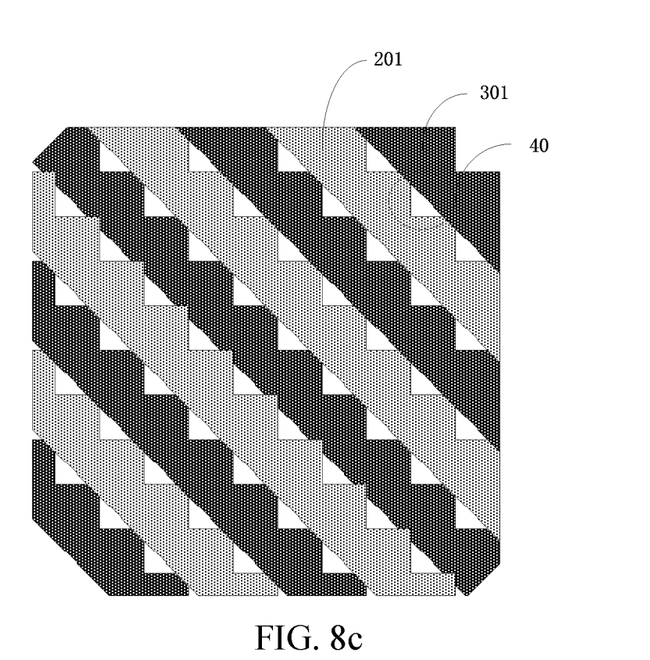
FIG. 8c is a top view of the first mask layer and the second mask layer in the semiconductor device according to yet another embodiment of the present disclosure.

In one embodiment, at least one side of the first strip mask 201 is provided with recesses 50 arranged at equal intervals, and at least one side of the second strip mask 301 is provided with recesses 50 arranged at equal intervals. The recess 50 of the first strip mask 201 jointly defines an opening 40 with the second strip mask 301. The recess 50 of the second strip mask 301 jointly defines an opening 40 with the first strip mask 201. For example, one side of the first strip mask 201 and one side of the second strip mask 301 are provided with equidistantly arranged recesses 50. The recess 50 of the first strip mask 201 and the corresponding recess 50 of the second strip mask 301 define an opening 40, as illustrated in FIGS. 8*a*, 8*b*, and 8*c*.

In one embodiment, both sides of the first strip mask 201 and both sides of the second strip mask 301 are provided with recesses 50 arranged at equal intervals. The recess 50 of the first strip mask 201 and the corresponding recess 50 of the second strip mask 301 define an opening 40, as illustrated in FIGS. 6*a*, 6*b*, and 6*c*.

Figure 7A:
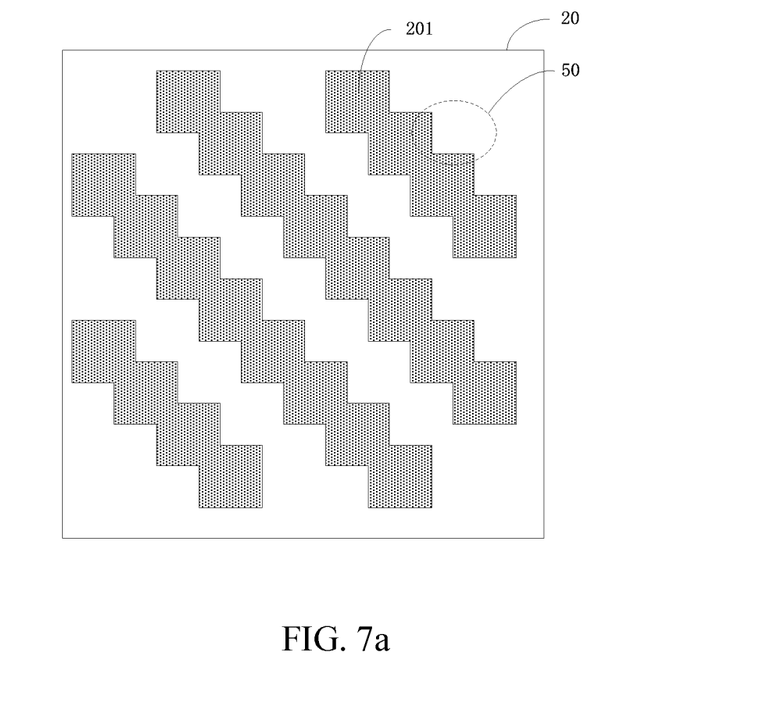
FIG. 7a is a top view of a first mask layer in a semiconductor device according to another embodiment of the present disclosure.
Figure 7B:
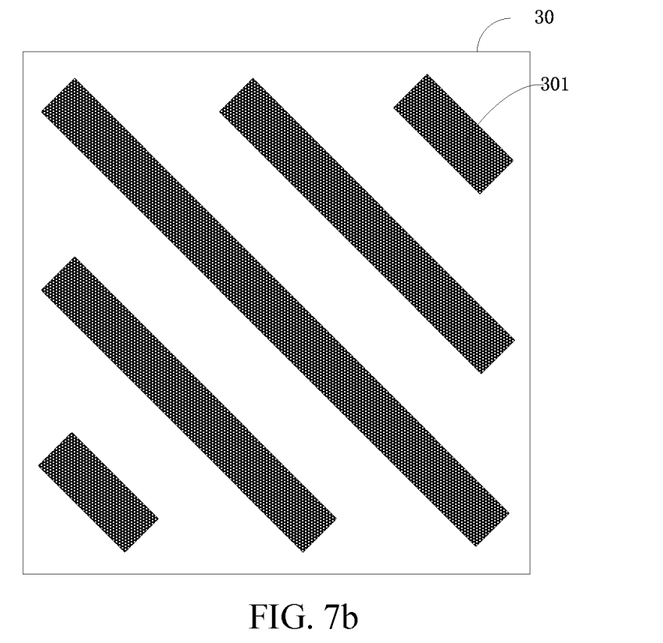
FIG. 7b is a top view of a second mask layer in the semiconductor device according to another embodiment of the present disclosure.
Figure 7C:
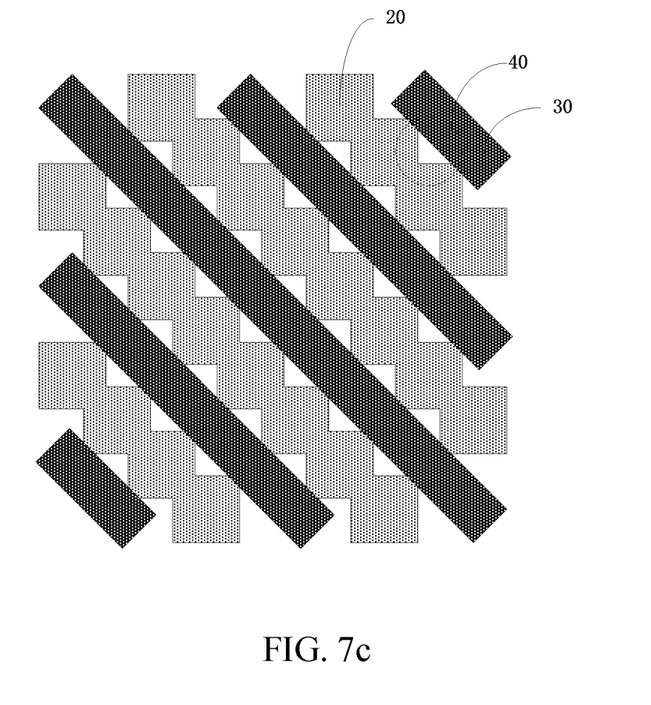
FIG. 7c is a top view of the first mask layer and the second mask layer in the semiconductor device according to another embodiment of the present disclosure.

In one embodiment, both sides of the first strip mask 201 or the second strip mask 301 are provided with equidistantly arranged recesses 50, and the recess 50 of the first strip mask 201 jointly define an opening 40 with the second strip mask 301, or the recess 50 of the second strip mask 301 jointly define an opening 40 with the first strip mask 201, as shown in FIGS. 7*a*, 7*b*, and 7*c*.

In one embodiment, the shape of the recess 50 includes a triangle, an arc, or a rectangle.

Figure 6A:
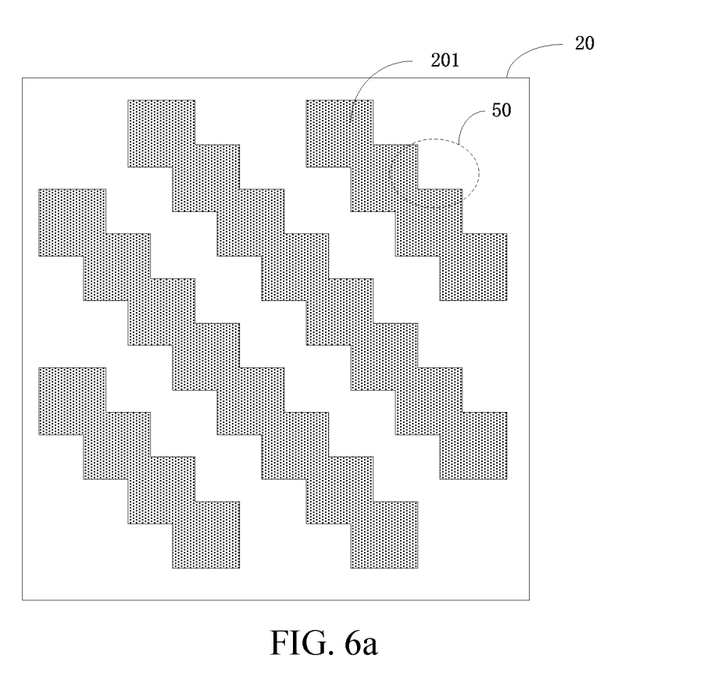
FIG. 6a is a top view of a first mask layer in the semiconductor device according to an embodiment of the present disclosure.
Figure 6B:
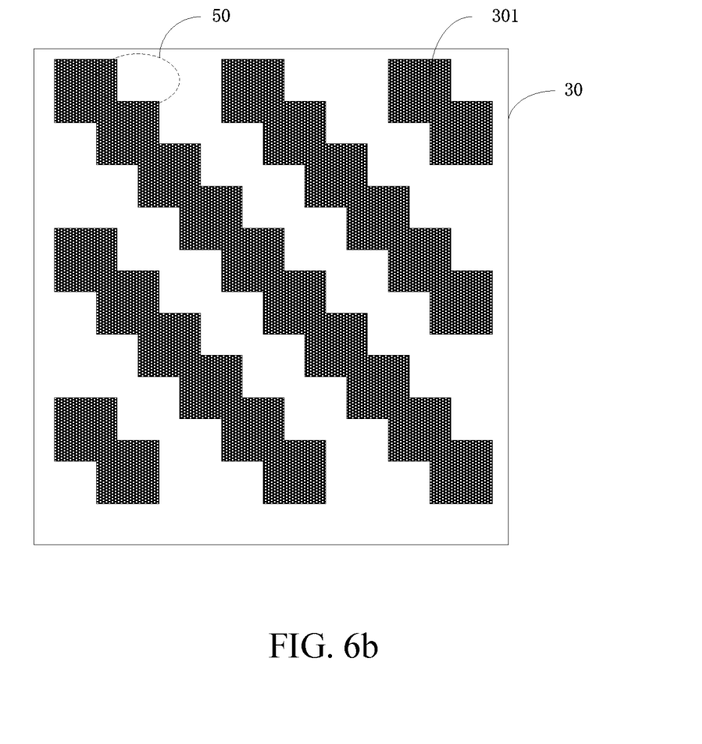
FIG. 6b is a top view of a second mask layer in the semiconductor device according to an embodiment of the present disclosure.
Figure 6C:
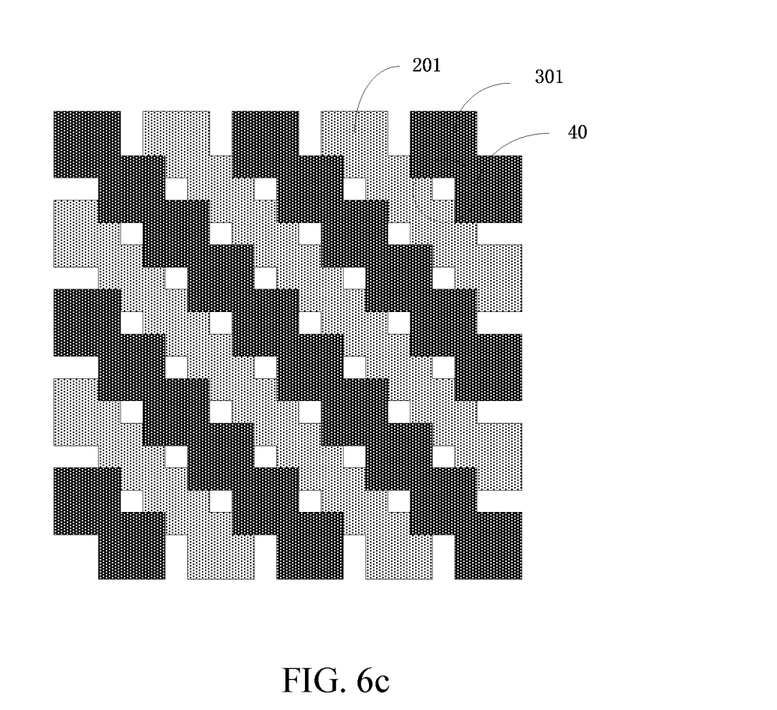
FIG. 6c is a top view of the first mask layer and the second mask layer in the semiconductor device according to an embodiment of the present disclosure.

In one of the embodiments, the shape of the recess 50 is a triangle, as illustrated in FIGS. 6*a*, 6*b*, and 6*c*.

Figure 10A:
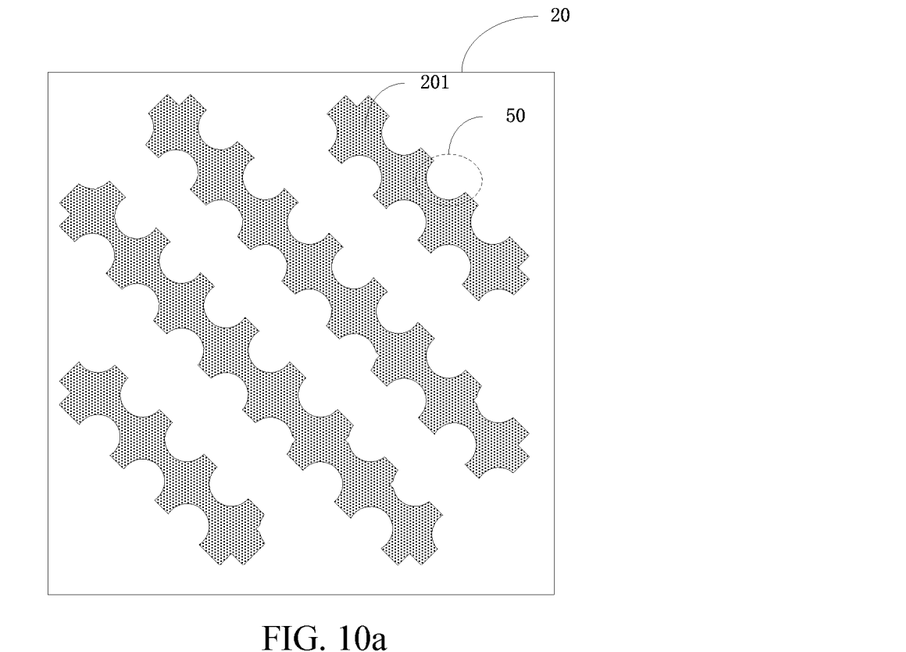
FIG. 10a is a top view of a first mask layer in a semiconductor device according to still another embodiment of the present disclosure.
Figure 10B:
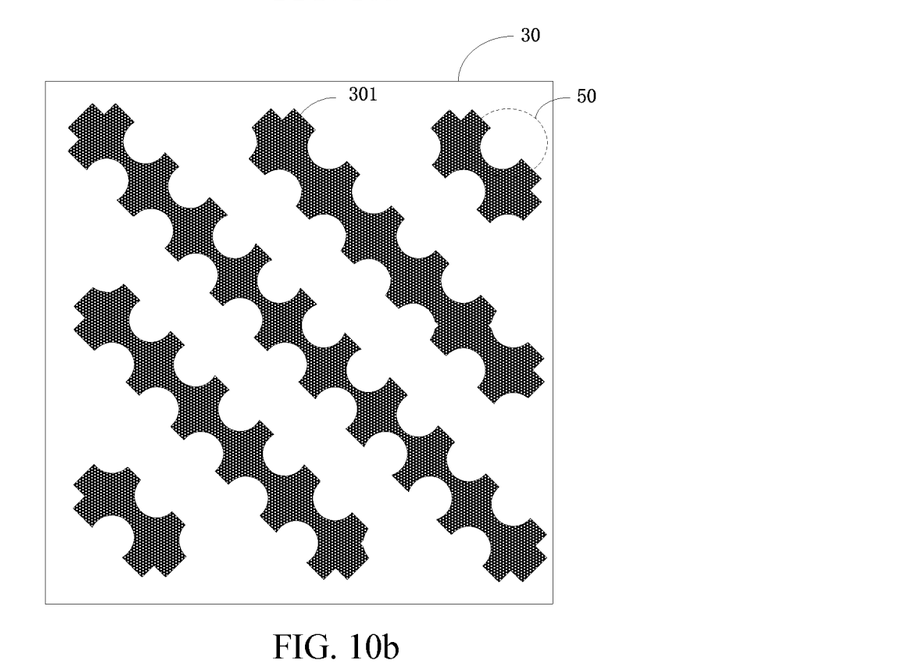
FIG. 10b is a top view of a second mask layer in the semiconductor device according to yet another embodiment of the present disclosure.
Figure 10C:
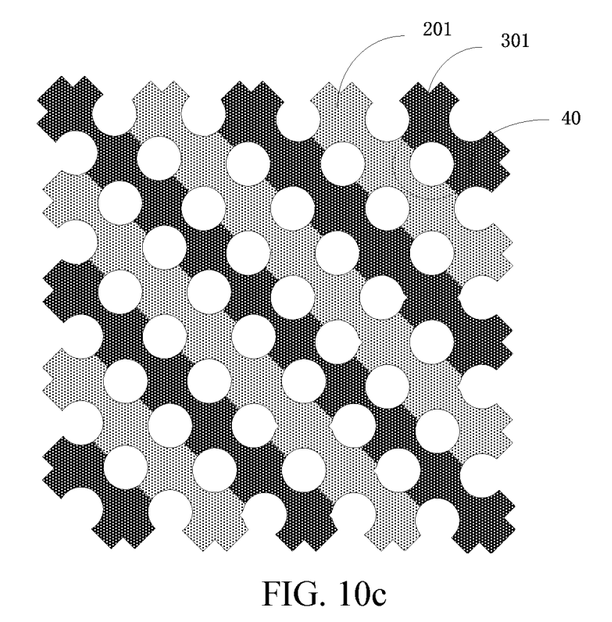
FIG. 10c is a top view of the first mask layer and the second mask layer in the semiconductor device according to yet another embodiment of the present disclosure.

In one embodiment, the shape of the recess 50 is an arc, as illustrated in FIGS. 10*a*, 10*b*, and 10*c*.

Figure 9A:
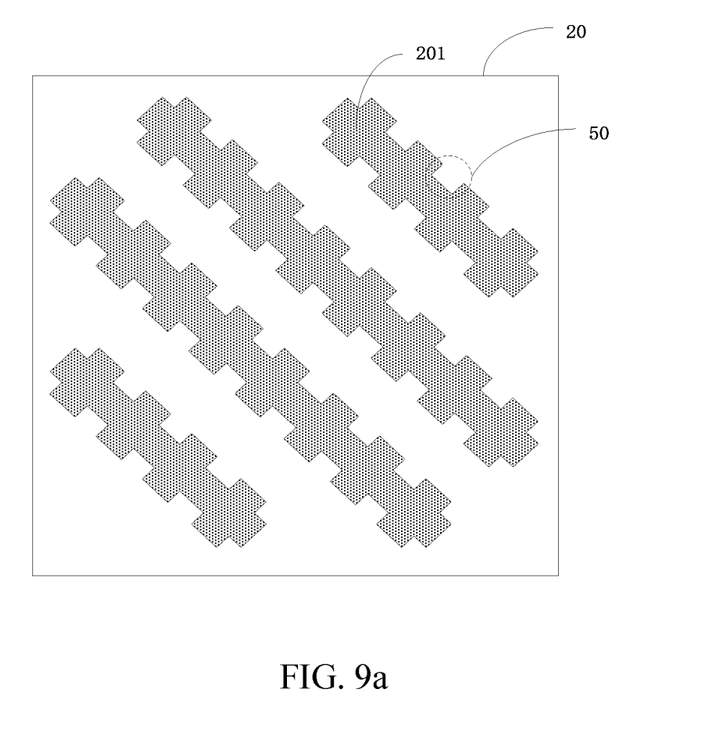
FIG. 9a is a top view of a first mask layer in a semiconductor device according to still another embodiment of the present disclosure.
Figure 9B:
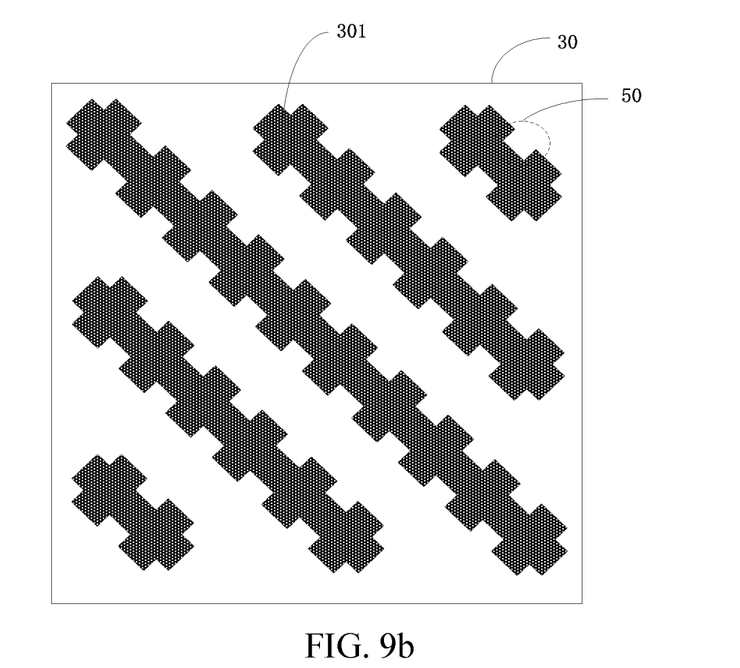
FIG. 9b is a top view of a second mask layer in the semiconductor device according to yet another embodiment of the present disclosure.
Figure 9C:
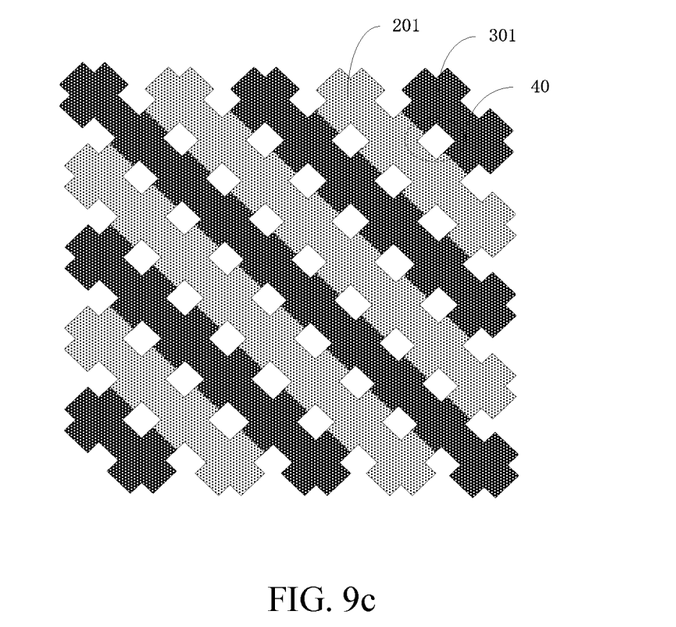
FIG. 9c is a top view of the first mask layer and the second mask layer in the semiconductor device according to yet another embodiment of the present disclosure.

In one of the embodiments, the shape of the recess 50 is a rectangle, as illustrated in FIGS. 9*a*, 9*b*, and 9*c*.

Figure 11A:
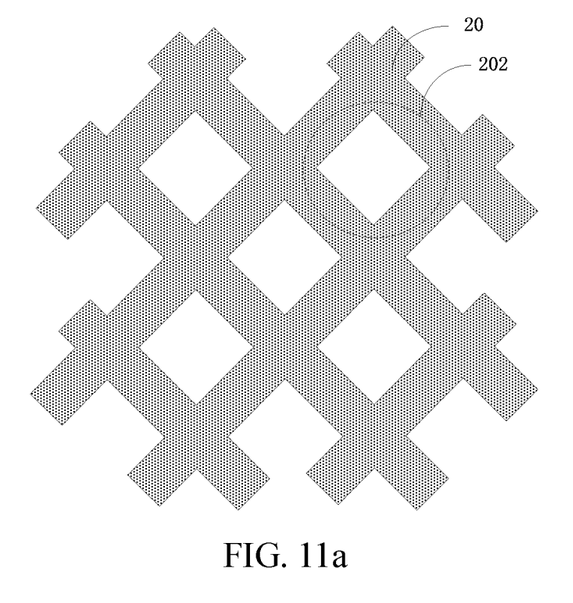
FIG. 11a is a top view of a first mask layer in a semiconductor device according to still another embodiment of the present disclosure.
Figure 11B:
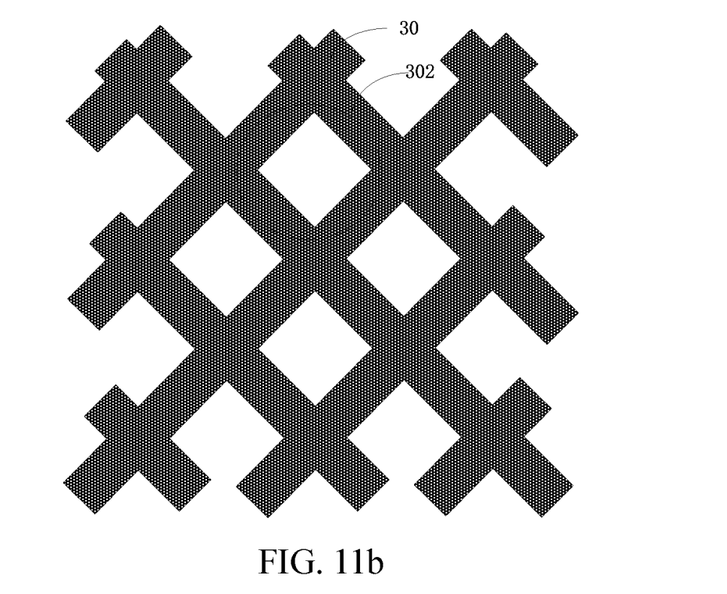
FIG. 11b is a top view of a second mask layer in the semiconductor device according to yet another embodiment of the present disclosure.
Figure 11C:
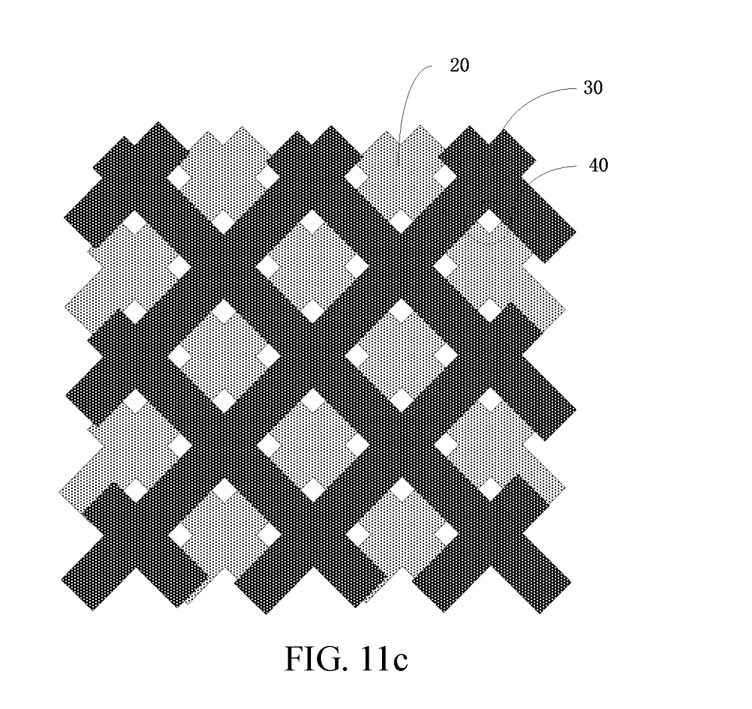
FIG. 11c is a top view of the first mask layer and the second mask layer in the semiconductor device according to still another embodiment of the present disclosure.

In one embodiment, the first mask layer 20 includes a plurality of first windows 202, the second mask layer 30 includes a plurality of second windows 302, and the first mask layer 20 and the second mask layer 30 are arranged in a staggered manner to define the openings 40, as illustrated in FIGS. 11*a*, 11*b*, and 11*c*.

In this embodiment, the first windows 202 are arranged in an array, and the second windows 302 are arranged in an array. The shapes of the first windows 202 and the second windows 302 include but are not limited to rectangles.

In an embodiment, as illustrated in FIG. 4, there is provided a semiconductor device including: a layer to be etched 10; a patterned first mask layer 20 formed on the layer to be etched 10; and a patterned second mask layer 30 formed on the layer 10 to be etched, where the second mask layer 30 and the first mask layer 20 jointly define an opening 40 that exposes the layer 10 to be etched.

In this embodiment, the above-described semiconductor device allows the feature size of the first mask layer 20 and the second mask layer 30 to be relatively larger while keeping the device feature size the same, makes it possible to further reduce the feature size of the device, and can also improve the yield of the device and save costs.

In one embodiment, the material of the first mask layer 20 includes one or more selected from the following materials: silicon oxide, silicon nitride, silicon carbide, silicon oxynitride, amorphous carbon, polysilicon, hafnium oxide, titanium oxide, zirconium oxide, titanium nitride, tantalum nitride, and titanium.

In one embodiment, the material of the second mask layer 30 includes one or more selected from the following materials: silicon oxide, silicon nitride, silicon carbide, silicon oxynitride, amorphous carbon, polysilicon, hafnium oxide, titanium oxide, zirconium oxide, titanium nitride, tantalum nitride, and titanium.

In this embodiment, the material of the first mask layer 20 is different than the material of the second mask layer 30, and a large etching selection ratio is required.

In another embodiment, a dielectric layer is further disposed between the first mask layer 20 and the second mask layer 30. The material of the dielectric layer is different than the material of the first mask layer 20 and the material of the second mask layer 30 and requires a large etching selection ratio.

In one embodiment, the material of the dielectric layer includes one or more selected from the following materials: silicon oxide, silicon nitride, silicon carbide, silicon oxynitride, amorphous carbon, polysilicon, hafnium oxide, titanium oxide, zirconium oxide, titanium nitride, tantalum nitride, and titanium.

In one embodiment, the opening 40 includes a bit line contact hole.

In one embodiment, the first mask layer 20 includes a plurality of first strip masks 201 parallel to each other, and the second mask layer 30 includes a plurality of second strip masks 301 parallel to each other. The plurality of first strip masks 201 and the plurality of second strip masks 301 are alternately arranged in side by side.

In this embodiment, the plurality of first strip masks 201 are arranged equidistantly, and the plurality of second strip masks 301 are arranged equidistantly.

In one embodiment, at least one side of the first strip mask 201 is provided with recesses 50 arranged at equal intervals, and at least one side of the second strip mask 301 is provided with recesses 50 arranged at equal intervals. The recess 50 of the first strip mask 201 jointly defines an opening 40 with the second strip mask 301. The recess 50 of the second strip mask 301 jointly defines an opening 40 with the first strip mask 201. For example, one side of the first strip mask 201 and one side of the second strip mask 301 are provided with equidistantly arranged recesses 50. The recess 50 of the first strip mask 201 and the corresponding recess 50 of the second strip mask 301 define an opening 40, as illustrated in FIGS. 8*a*, 8*b*, and 8*c*.

In one embodiment, both sides of the first strip mask 201 and both sides of the second strip mask 301 are provided with recesses 50 arranged at equal intervals. The recess 50 of the first strip mask 201 and the corresponding recess 50 of the second strip mask 301 define an opening 40, as illustrated in FIGS. 6*a*, 6*b*, and 6*c*.

In one embodiment, both sides of the first strip mask 201 or the second strip mask 301 are provided with equidistantly arranged recesses 50, and the recess 50 of the first strip mask 201 jointly define an opening 40 with the second strip mask 301, or the recess 50 of the second strip mask 301 jointly define an opening 40 with the first strip mask 201, as shown in FIGS. 7*a*, 7*b*, and 7*c*.

In one embodiment, the shape of the recess 50 includes a triangle, an arc, or a rectangle.

In one of the embodiments, the shape of the recess 50 is a triangle, as illustrated in FIGS. 6*a*, 6*b*, and 6*c*.

In one embodiment, the shape of the recess 50 is an arc, as illustrated in FIGS. 10*a*, 10*b*, and 10*c*.

In one of the embodiments, the shape of the recess 50 is a rectangle, as illustrated in FIGS. 9*a*, 9*b*, and 9*c*.

In one embodiment, the first mask layer 20 includes a plurality of first windows 202, the second mask layer 30 includes a plurality of second windows 302, and the first mask layer 20 and the second mask layer 30 are arranged in a staggered manner to define the openings 40, as illustrated in FIGS. 11*a*, 11*b*, and 11*c*.

In this embodiment, the first windows 202 are arranged in an array, and the second windows 302 are arranged in an array. The shapes of the first windows 202 and the second windows 302 include but are not limited to rectangles.

The order of the formation of the first mask layer 20 and the second mask layer 30 as well as the positions where they are formed in the above embodiments can be interchanged. The layout direction of the opening 40 relative to the layer to be etched 10 can be adjusted arbitrarily as required. The layout directions of the first mask layer 20 and the second mask layer 30 relative to the layer to be etched 10 can be adjusted arbitrarily as required. The above should all be regarded as fall in the scope of this specification.

The technical features of the above embodiments can be combined in any desirable manner. For the sake of conciseness, all possible combinations of the technical features in the above embodiments are not to be and cannot be exhausted. However, as long as no contradiction or conflict is present in the combination of these technical features, they are all to be regarded as fall in the range of this specification.

The foregoing embodiments merely illustrate some specific embodiments according to the present disclosure in a relatively specific and detailed manner, but it should not be understood as a limitation on the scope of protection of the present disclosure. It should be pointed out that for those having ordinary skill in the art, numerous modifications and improvements can be made without departing from the concept and spirit of the present disclosure and these shall all fall in the scope of protection of the present disclosure. Therefore, the scope of protection of the present disclosure should be defined in and by the appended claims.

What is claimed is:

1. A method of manufacturing a semiconductor device, comprising:
    providing a layer to be etched;
    forming a patterned first mask layer on the layer to be etched, wherein the first mask layer comprises a plurality of first strip masks disposed parallel to each other
    forming a patterned second mask layer on the layer to be etched, wherein the second mask layer comprises a plurality of second strip masks disposed parallel to each other, wherein the second mask layer and the first mask layer jointly defining openings to expose the layer to be etched and the plurality of first strip masks and the plurality of second strip masks are alternately disposed in parallel; and
    etching the layer to be etched using the first mask layer and the second mask layer as masks thus forming a pattern to be etched;
    wherein both sides of a first strip mask or both sides of a second strip mask comprise recesses that are arranged at regular intervals, wherein the recesses of the first strip mask jointly define the openings with the corresponding second strip mask, or the recesses of the second strip mask jointly define the openings with the corresponding first strip mask;
    wherein the recesses are defined in a top view; wherein shape of the recesses comprises a triangle, an arc, or a rectangle.

2. The method of claim 1, wherein the first mask layer further defines a plurality of first windows, the second mask layer comprises a plurality of second windows, and wherein first mask layer and the second mask layer are arranged in a staggered manner to form the openings.

3. The method of claim 1, further comprising forming a dielectric layer on the first mask layer, subsequent to the forming the first mask layer.

4. A semiconductor device, comprising:
    a layer to be etched;
    a patterned first mask layer formed on the layer to be etched; wherein the first mask layer comprises a plurality of first strip masks disposed parallel to each other
    a patterned second mask layer formed on the layer to be etched, wherein the second mask layer comprises a plurality of second strip masks disposed parallel to each other, wherein the second mask layer and the first mask layer jointly defining openings to expose the layer to be etched and the plurality of first strip masks and the plurality of second strip masks are alternately disposed in parallel;
    wherein both sides of a first strip mask or both sides of a second strip mask comprise recesses that are arranged at regular intervals, wherein the recesses of the first strip mask jointly define the openings with the corresponding second strip mask, or the recesses of the second strip mask jointly define the openings with the corresponding first strip mask;
    wherein the recesses are defined in a top view;
    wherein shape of the recesses comprises a triangle, an arc, or a
    rectangle.

5. The semiconductor device of claim 4, wherein the first mask layer further defines a plurality of first windows, the second mask layer comprises a plurality of second windows, and wherein first mask layer and the second mask layer are arranged in a staggered manner to form the openings.

6. The semiconductor device of claim 4, further comprising a dielectric layer disposed between the first mask layer and the second mask layer.

* * * * *